(12) United States Patent
Zhao

(10) Patent No.: US 10,115,363 B2
(45) Date of Patent: Oct. 30, 2018

(54) GATE DRIVING CIRCUITS AND THE LIQUID CRYSTAL DEVICES THEREOF

(71) Applicant: Wuhan China Star Optoelectronics Technology Co., Ltd., Wuhan, Hubei (CN)

(72) Inventor: Mang Zhao, Guangdong (CN)

(73) Assignee: Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 309 days.

(21) Appl. No.: 14/917,947

(22) PCT Filed: Feb. 22, 2016

(86) PCT No.: PCT/CN2016/074227
§ 371 (c)(1),
(2) Date: Mar. 10, 2016

(87) PCT Pub. No.: WO2017/124597
PCT Pub. Date: Jul. 27, 2017

(65) Prior Publication Data
US 2018/0061348 A1 Mar. 1, 2018

(30) Foreign Application Priority Data
Jan. 21, 2016 (CN) .......................... 2016 1 0040439

(51) Int. Cl.
*G09G 3/36* (2006.01)
*G09G 3/20* (2006.01)
*G11C 19/28* (2006.01)

(52) U.S. Cl.
CPC .............. *G09G 3/3677* (2013.01); *G09G 3/20* (2013.01); *G09G 3/3614* (2013.01); *G11C 19/28* (2013.01);
(Continued)

(58) Field of Classification Search
CPC ...... G09G 3/3677; G09G 3/3614; G09G 3/20; G09G 2310/061; G09G 2300/0408; G09G 2310/0218; G09G 2310/08; G11C 19/28
See application file for complete search history.

(56) References Cited

U.S. PATENT DOCUMENTS

2016/0188074 A1* 6/2016 Xiao ...................... G06F 3/0416
345/173
2017/0162152 A1* 6/2017 Zhao .................... G09G 3/3677

* cited by examiner

Primary Examiner — Abhishek Sarma
(74) Attorney, Agent, or Firm — Andrew C. Cheng

(57) ABSTRACT

The present disclosure relates to a gate driving circuit and the LCD thereof. The input circuit generates second control signals in accordance with up-level normal-phase scanning driving signals, up-level inverting-phase scanning driving signals, and first control signals outputted by the latch circuit. The reset and control circuit generates third control signals in accordance with reset signals, the first control signals, and the second control signals. The inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, The latch circuit generates the first control signals in accordance with the third control signals and second clock signals, and latches or changes a voltage state of the third control signals in accordance with the second clock signals.

11 Claims, 4 Drawing Sheets

(52) U.S. Cl.
CPC ............... *G09G 2300/0408* (2013.01); *G09G 2310/0218* (2013.01); *G09G 2310/061* (2013.01); *G09G 2310/08* (2013.01)

GATE DRIVING CIRCUITS AND THE LIQUID CRYSTAL DEVICES THEREOF

BACKGROUND OF THE INVENTION

1. Field of the Invention

The present disclosure relates to liquid crystal display technology, and more particularly to a blue-phase liquid crystal panel.

2. Discussion of the Related Art

Gate Driver On Array (GOA) relates to the technology adopting conventional TFT LCD Array manufacturing process to configure the scanning driving signals circuit of Gate row on the Array substrate so as to perform the Gate scanning toward each of the rows.

With the development of LTPS, the corresponding peripheral integrated circuit of the panel has been the focus due to the attribute of the high carrier mobility of LTPS. In addition, a great number of people focus on the research of system on panel (SOP).

Regarding the conventional gate driving circuit, the voltage inputting to the node of the output circuit is controlled to generate the scanning driving signals of the current level. However, the voltage is usually generated by a high-reference circuit pathway, which may cause loss when the high-reference level is divided by a plurality of transistor. As such, the generation speed of the scanning driving signals of the current level may be affected, and the panel may not be normally driven. Further, the driving circuit may fail.

SUMMARY

The present disclosure relates to a gate driving circuit and the LCD thereof to enhance the driving capability of the transmission signals so as to reduce the generation delay of the scanning driving signals of the current level.

In one aspect, a gate driving circuit includes: an input circuit, a reset and control circuit, an inverting circuit, a latch circuit, and an output circuit, the input circuit generates second control signals in accordance with up-level normal-phase scanning driving signals, up-level inverting-phase scanning driving signals, and first control signals outputted by the latch circuit, the reset and control circuit generates third control signals in accordance with reset signals, the first control signals, and the second control signals, the inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, the latch circuit generates the first control signals in accordance with the third control signals and second clock signals, and latches or changes a voltage state of the third control signals in accordance with the second clock signals; wherein the input circuit includes a first transmission gate and a first P-type transistor; a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; a control end of the first P-type transistor receives the up-level inverting-phase scanning driving signals, and a first transmission end of the first P-type transistor connects to a high reference level, and a second transmission end of the first P-type transistor connects to the second transmission end of the first transmission gate; wherein the output circuit includes a NAND gate and a plurality of second inverters serially connected, a first input end of the NAND gate receives the first clock signals, a second input end of the NAND gate receives the fourth control signals, an output end of the NAND gate connects with an upstream input end of the second inverters serially connected, the output end of the M-th second inverter outputs the current-level inverting-phase scanning driving signals, the output end of the N-th second inverter outputs the current-level normal-phase scanning driving signals, wherein M is an even number and N is an odd number.

In another aspect, a gate driving circuit includes: an input circuit, a reset and control circuit, an inverting circuit, a latch circuit, and an output circuit, the input circuit generates second control signals in accordance with up-level normal-phase scanning driving signals, up-level inverting-phase scanning driving signals, and first control signals outputted by the latch circuit, the reset and control circuit generates third control signals in accordance with reset signals, the first control signals, and the second control signals, the inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, the latch circuit generates the first control signals in accordance with the third control signals and second clock signals, and latches or changes a voltage state of the third control signals in accordance with the second clock signals.

Wherein the input circuit includes a first transmission gate and a first P-type transistor; a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; and a control end of the first P-type transistor receives the up-level inverting-phase scanning driving signals, and a first transmission end of the first P-type transistor connects to a high reference level, and a second transmission end of the first P-type transistor connects to the second transmission end of the first transmission gate.

Wherein the reset and control circuit includes a second P-type transistor, a third P-type transistor, a fourth P-type transistor, a first N-type transistor, a second N-type transistor, and a third N-type transistor; a first transmission end of the second P-type transistor connects to the high reference level; a first transmission end of the third P-type transistor connects to the second transmission end of the second P-type transistor, one of a control end of the second P-type transistor and a control end of the third P-type transistor receives the first control signals, and the other one receives the second control signals; a control end of the fourth P-type transistor receives the reset signals, a first transmission end of the fourth P-type transistor connects to the high reference level, and a second transmission end of the fourth P-type transistor connects to the second transmission end of the third P-type transistor; a control end of the first N-type transistor receives the reset, a first transmission end of the first N-type transistor connects to a connecting node of the second transmission end of the third P-type transistor and a second transmission end of the fourth P-type transistor; a control end of the second N-type transistor receives the first control signals, a first transmission end of the second N-type transistor connects to the second transmission end of the first N-type transistor, and a second transmission end of the second N-type transistor connects to a low-reference level; a control end of the third N-type transistor receives the second control signals, a first transmission end of the third N-type transistor connects to the second transmission end of the first N-type transistor, and a second transmission end of the third N-type transistor connects to the low-reference level; and wherein the third control signals are outputted from the connecting node of the second transmission end of the third P-type transistor and the second transmission end of the fourth P-type transistor.

Wherein the inverting circuit includes a first inverter, an input end of the first inverter receives the third control signals, and an output end of the first inverter outputs the fourth control signals.

Wherein the output circuit includes a NAND gate and a plurality of second inverters serially connected; and a first input end of the NAND gate receives the first clock signals, a second input end of the NAND gate receives the fourth control signals, an output end of the NAND gate connects with an upstream input end of the second inverters serially connected, the output end of the M-th second inverter outputs the current-level inverting-phase scanning driving signals, the output end of the N-th second inverter outputs the current-level normal-phase scanning driving signals, wherein M is an even number and N is an odd number.

Wherein the latch circuit includes a second transmission gate and a fourth N-type transistor; a P-type control end of the second transmission gate receives the third control signals, a N-type control end of the second transmission gate receives the fourth control signals, a first transmission end of the second transmission gate receives the second clock signals, and a second transmission end of the second transmission gate outputs the first control signals; and a control end of the fourth N-type transistor receives the third control signals, a first transmission end of the fourth N-type transistor connects to the low-reference level, and a first transmission end of the fourth N-type transistor connects to the second transmission end of the second transmission gate.

Wherein the latch circuit further includes a third inverter, an input end of the third inverter receives the second clock signals, and an output end of the third inverter connects to the first transmission end of the second transmission gate.

Wherein the input circuit includes a first transmission gate and a first P-type transistor; a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; a control end of the first N-type transistor receives the up-level normal-phase scanning driving signals, a first transmission end of the first N-type transistor connects to the low-reference level, and the second transmission end of the first N-type transistor connects to the second transmission end of the first transmission gate; the reset and control circuit includes a second N-type transistor, a third N-type transistor, a fourth N-type transistor, a first P-type transistor, a second P-type transistor, and a third P-type transistor; the first transmission end of the second N-type transistor connects to the low-reference level; a first transmission end of the third N-type transistor connects with the second transmission end of the second N-type transistor, one of the control end of the second N-type transistor and the third N-type transistor receives the first control signals, and the other one receives the third control signals; a control end of the fourth N-type transistor receives the reset signals, the first transmission end of the fourth N-type transistor connects to the low-reference level, and the second transmission end of the fourth N-type transistor connects with the second transmission end of the third N-type transistor; a control end of the third P-type transistor receives the reset signals, and a first transmission end of the first P-type transistor connects to the high reference level; a control end of the second P-type transistor receives the first control signals, a first transmission end of the second P-type transistor connects with the second transmission end of the first P-type transistor, a second transmission end of the second P-type transistor connects with the connecting node of the second transmission end of the third N-type transistor and the second transmission end of the fourth N-type transistor; a control end of the third P-type transistor receives the second control signals, a first transmission end of the third P-type transistor connects to the second transmission end of the first P-type transistor, a second transmission end of the third P-type transistor connects to the connecting node of the second transmission end of the third N-type transistor and the second transmission end of the fourth N-type transistor; and wherein the third control signals are outputted from the connecting node of the second transmission end of the third N-type transistor and the second transmission end of the fourth N-type transistor.

Wherein the inverting circuit includes the first inverter and the second inverter; an input end of the first inverter receives the third control signals; an input end of the second inverter connects to the input end of the first inverter, and an output end of the second inverter outputs the fourth control signals; the output circuit includes the NAND gate and a plurality of third inverters serially connected; a first input end of the NAND gate receives the first clock signals, a second input end of the NAND gate receives the fourth control signals, an output end of the NAND gate connects with upstream input ends of the third inverters serially connected, the output ends of the M-th third inverter output the current-level inverting-phase scanning driving signals, the output end of the N-th third inverter output the current-level normal-phase scanning driving signals, wherein M is an even number and N is an odd number; the latch circuit includes the second transmission gate and the fourth P-type transistor; a N-type control end of the second transmission gate receives the third control signals, a P-type control end of the second transmission gate receives the fourth control signals, a first transmission end of the selection signals receives the second clock signals, and the second transmission end of the second transmission gate outputs the first control signals; and a control end of the fourth P-type transistor receives the third control signals, a first transmission end of the fourth P-type transistor connects to the low-reference level, and the first transmission end of the fourth P-type transistor connects to the second transmission end of the second transmission gate.

In another aspect, a liquid crystal device (LCD) includes: a plurality of cascaded gate driving circuits, the gate driving circuit includes: an input circuit, a reset and control circuit, an inverting circuit, a latch circuit, and an output circuit, the input circuit generates second control signals in accordance with up-level normal-phase scanning driving signals, up-level inverting-phase scanning driving signals, and first control signals outputted by the latch circuit, the reset and control circuit generates third control signals in accordance with reset signals, the first control signals, and the second control signals, the inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, the latch circuit generates the first control signals in accordance with the third control signals and second clock signals, and latches or changes a voltage state of the third control signals in accordance with the second clock signals.

Wherein the input circuit includes a first transmission gate and a first P-type transistor; a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; and a control end of the first P-type transistor receives the up-level inverting-phase scanning driving signals, and a first transmission end of the first P-type transistor connects to a high reference level, and a second transmission end of the first P-type transistor connects to the second transmission end of the first transmission gate.

Wherein the reset and control circuit includes a second P-type transistor, a third P-type transistor, a fourth P-type transistor, a first N-type transistor, a second N-type transistor, and a third N-type transistor; a first transmission end of the second P-type transistor connects to the high reference level; a first transmission end of the third P-type transistor connects to the second transmission end of the second P-type transistor, one of a control end of the second P-type transistor and a control end of the third P-type transistor receives the first control signals, and the other one receives the second control signals; a control end of the fourth P-type transistor receives the reset signals, a first transmission end of the fourth P-type transistor connects to the high reference level, and a second transmission end of the fourth P-type transistor connects to the second transmission end of the third P-type transistor; a control end of the first N-type transistor receives the reset, a first transmission end of the first N-type transistor connects to a connecting node of the second transmission end of the third P-type transistor and a second transmission end of the fourth P-type transistor; a control end of the second N-type transistor receives the first control signals, a first transmission end of the second N-type transistor connects to the second transmission end of the first N-type transistor, and a second transmission end of the second N-type transistor connects to a low-reference level; a control end of the third N-type transistor receives the second control signals, a first transmission end of the third N-type transistor connects to the second transmission end of the first N-type transistor, and a second transmission end of the third N-type transistor connects to the low-reference level; and wherein the third control signals are outputted from the connecting node of the second transmission end of the third P-type transistor and the second transmission end of the fourth P-type transistor.

Wherein the inverting circuit includes a first inverter, an input end of the first inverter receives the third control signals, and an output end of the first inverter outputs the fourth control signals.

Wherein the output circuit includes a NAND gate and a plurality of second inverters serially connected; and a first input end of the NAND gate receives the first clock signals, a second input end of the NAND gate receives the fourth control signals, an output end of the NAND gate connects with an upstream input end of the second inverters serially connected, the output end of the M-th second inverter outputs the current-level inverting-phase scanning driving signals, the output end of the N-th second inverter outputs the current-level normal-phase scanning driving signals, wherein M is an even number and N is an odd number.

Wherein the latch circuit includes a second transmission gate and a fourth N-type transistor; a P-type control end of the second transmission gate receives the third control signals, a N-type control end of the second transmission gate receives the fourth control signals, a first transmission end of the second transmission gate receives the second clock signals, and a second transmission end of the second transmission gate outputs the first control signals; and a control end of the fourth N-type transistor receives the third control signals, a first transmission end of the fourth N-type transistor connects to the low-reference level, and a first transmission end of the fourth N-type transistor connects to the second transmission end of the second transmission gate.

Wherein the latch circuit further includes a third inverter, an input end of the third inverter receives the second clock signals, and an output end of the third inverter connects to the first transmission end of the second transmission gate.

Wherein the input circuit includes a first transmission gate and a first P-type transistor; a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; a control end of the first N-type transistor receives the up-level normal-phase scanning driving signals, a first transmission end of the first N-type transistor connects to the low-reference level, and the second transmission end of the first N-type transistor connects to the second transmission end of the first transmission gate; the reset and control circuit includes a second N-type transistor, a third N-type transistor, a fourth N-type transistor, a first P-type transistor, a second P-type transistor, and a third P-type transistor; the first transmission end of the second N-type transistor connects to the low-reference level; a first transmission end of the third N-type transistor connects with the second transmission end of the second N-type transistor, one of the control end of the second N-type transistor and the third N-type transistor receives the first control signals, and the other one receives the third control signals; a control end of the fourth N-type transistor receives the reset signals, the first transmission end of the fourth N-type transistor connects to the low-reference level, and the second transmission end of the fourth N-type transistor connects with the second transmission end of the third N-type transistor; a control end of the third P-type transistor receives the reset signals, and a first transmission end of the first P-type transistor connects to the high reference level; a control end of the second P-type transistor receives the first control signals, a first transmission end of the second P-type transistor connects with the second transmission end of the first P-type transistor, a second transmission end of the second P-type transistor connects with the connecting node of the second transmission end of the third N-type transistor and the second transmission end of the fourth N-type transistor; a control end of the third P-type transistor receives the second control signals, a first transmission end of the third P-type transistor connects to the second transmission end of the first P-type transistor, a second transmission end of the third P-type transistor connects to the connecting node of the second transmission end of the third N-type transistor and the second transmission end of the fourth N-type transistor; and wherein the third control signals are outputted from the connecting node of the second transmission end of the third N-type transistor and the second transmission end of the fourth N-type transistor.

Wherein the inverting circuit includes the first inverter and the second inverter; an input end of the first inverter receives the third control signals; an input end of the second inverter connects to the input end of the first inverter, and an output end of the second inverter outputs the fourth control signals; the output circuit includes the NAND gate and a plurality of third inverters serially connected; a first input end of the NAND gate receives the first clock signals, a second input end of the NAND gate receives the fourth control signals, an output end of the NAND gate connects with upstream input ends of the third inverters serially connected, the output ends of the M-th third inverter output the current-level inverting-phase scanning driving signals, the output end of the N-th third inverter output the current-level normal-phase scanning driving signals, wherein M is an even number and N is an odd number; the latch circuit includes the second transmission gate and the fourth P-type transistor; a N-type control end of the second transmission gate receives the third control signals, a P-type control end of the second transmission gate receives the fourth control signals, a first transmission end of the selection signals receives the second clock signals, and the second transmission end of the second transmission gate outputs the first control signals; and a control end of the fourth P-type transistor receives the third control signals, a first transmission end of the fourth P-type transistor connects to the low-reference level, and the first transmission end of the fourth P-type transistor connects to the second transmission end of the second transmission gate.

In view of the above, the structure of the circuit is changed, the original NOR gate is replaced by the NAND gate. The driving capability of the transmission signals may be enhanced so as to reduce the generation delay of the scanning driving signals of the current level.

DETAILED DESCRIPTION OF THE EMBODIMENTS

Embodiments of the invention will now be described more fully hereinafter with reference to the accompanying drawings, in which embodiments of the invention are shown.

Figure 1:
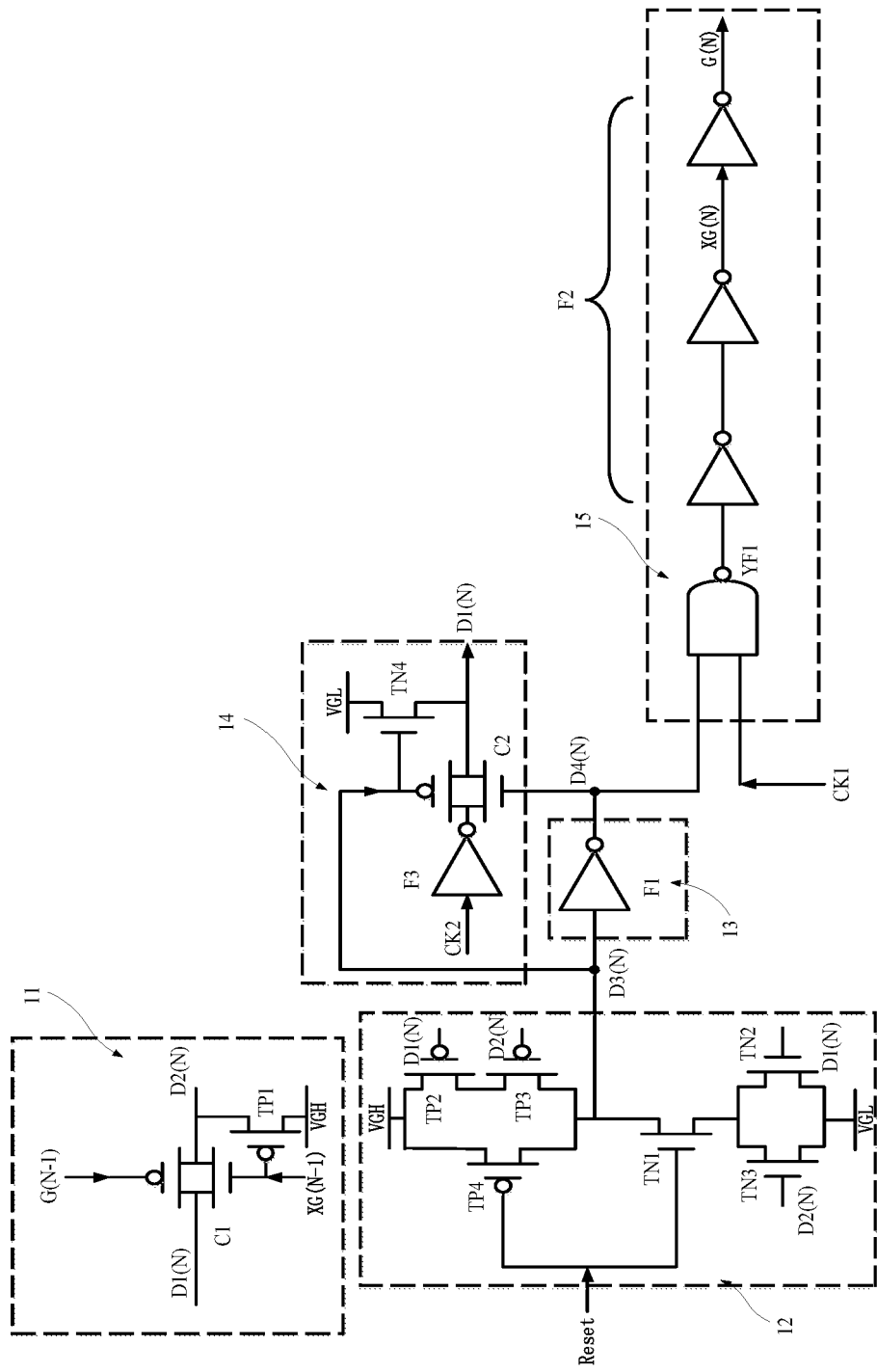
FIG. 1 is a circuit diagram of the gate driving circuit in accordance with a first embodiment.

FIG. 1 is a circuit diagram of the gate driving circuit in accordance with a first embodiment. The gate driving circuit includes: an input circuit 11, a reset and control circuit 12, an inverting circuit 13, a latch circuit 14, and an output circuit 15. The input circuit 11 generates second control signals D2(N) in accordance with up-level normal-phase scanning driving signals G(N−1), up-level inverting-phase scanning driving signals XG(N−1), and first control signals D1(N) outputted by the latch circuit 14. The reset and control circuit 12 generates third control signals D3(N) in accordance with reset signals (Reset), the first control signals D1(N), and the second control signals D2(N). The inverting circuit 13 performs an inverting process at least once toward the third control signals D3(N), and generates fourth control signals D4(N). The output circuit 15 generates current-level normal-phase scanning driving signals G(N) and the current-level inverting-phase scanning driving signals XG(N) in accordance with the fourth control signals D4(N) and first clock signals (CK1). The latch circuit 14 generates the first control signals D1(N) in accordance with the third control signals D3(N) and second clock signals (CK2), and latches or changes a voltage state of the third control signals D3(N) in accordance with the second clock signals (CK2).

The input circuit 11 includes a first transmission gate (C1) and a first P-type transistor (TP1), wherein the first transmission gate (C1) may be the CMOS transmission gate including a NMOS transistor (TN) and a PMOS transistor (TP) connected in parallel. As the structure of the MOS transistor is symmetrical, that is, the source and the drain are interchangeable. Thus, the input end and the output end of the transmission gate may be interchangeable. That is, the CMOS transmission gate is bidirectional, and thus is referred to as controllable bi-directional switch. In addition, the above transistor may be one thin film transistor (TFT).

A N-type control end of the first transmission gate (C1) receives the up-level inverting-phase scanning driving signals XG(N−1), and a P-type control end of the first transmission gate (C1) receives the up-level normal-phase scanning driving signals G(N−1). A first transmission end of the first transmission gate (C1) receives the first control signals D1(N), and a second transmission end of the first transmission gate (C1) outputs the second control signals D2(N).

A control end of the first P-type transistor (TP1) receives the up-level inverting-phase scanning driving signals XG(N−1), and a first transmission end of the first P-type transistor (TP1) connects to a high reference level (VGH), and a second transmission end of the first P-type transistor (TP1) connects to the second transmission end of the first transmission gate (C1).

The reset and control circuit 12 includes a second P-type transistor (TP2), a third P-type transistor (TP3), a fourth P-type transistor (TP4), a first N-type transistor (TN1), a second N-type transistor (TN2), and a third N-type transistor (TN3).

A first transmission end of the second P-type transistor (TP2) connects to the high reference level (VGH), a first transmission end of the third P-type transistor (TP3) connects to the second transmission end of the second P-type transistor (TP2), one of a control end of the second P-type transistor (TP2) and a control end of the third P-type transistor (TP3) receives the first control signals D1(N), and the other one receives the second control signals D2(N). In the embodiment, the second P-type transistor (TP2) receives the first control signals D1(N), and the control end of the third P-type transistor (TP3) receives the second control signals D2(N), and vice versa.

A control end of the fourth P-type transistor (TP4) receives the reset signals (Reset), a first transmission end of the fourth P-type transistor (TP4) connects to the high reference level (VGH), and a second transmission end of the fourth P-type transistor (TP4) connects to the second transmission end of the third P-type transistor (TP3). A control end of the first N-type transistor (TN1) receives the reset, a first transmission end of the first N-type transistor (TN1) connects to a connecting node of the second transmission end of the third P-type transistor (TP3) and a second transmission end of the fourth P-type transistor (TP4).

A control end of the second N-type transistor (TN2) receives the first control signals D1(N), a first transmission end of the second N-type transistor (TN2) connects to the second transmission end of the first N-type transistor (TN1), and a second transmission end of the second N-type transistor (TN2) connects to a low-reference level (VGL). A control end of the third N-type transistor (TN3) receives the second control signals D2(N), a first transmission end of the third N-type transistor (TN3) connects to the second transmission end of the first N-type transistor (TN1), and a second transmission end of the third N-type transistor (TN3) connects to the low-reference level (VGL).

The third control signals D3(N) are outputted from the connecting node of the second transmission end of the third P-type transistor (TP3) and the second transmission end of the fourth P-type transistor (TP4).

The inverting circuit 13 includes a first inverter (F1). An input end of the first inverter (F1) receives the third control signals D3(N), and an output end of the first inverter (F1) outputs the fourth control signals D4(N). The inverter may invert a phase of the input signals for 180 degrees. Such circuit may be adopted in simulation circuit, such as amplifying the audio or clock oscillator. The inverter may be a TTL NOT gate, which is also one CMOS inverter.

The output circuit 15 includes a NAND gate (YF1) and a plurality of second inverters (F2) serially connected. A first input end of the NAND gate (YF1) receives the first clock signals (CK1), a second input end of the NAND gate (YF1) receives the fourth control signals D4(N), an output end of the NAND gate (YF1) connects with an upstream input end of the second inverters (F2) serially connected, the output end of the M-th second inverter (F2) outputs the current-level inverting-phase scanning driving signals XG(N), the output end of the N-th second inverter (F2) outputs the current-level normal-phase scanning driving signals G(N), wherein M is an even number and N is an odd number.

The latch circuit 14 includes a second transmission gate (C2) and a fourth N-type transistor (TN4). A P-type control end of the second transmission gate (C2) receives the third control signals D3(N), a N-type control end of the second transmission gate (C2) receives the fourth control signals D4(N), a first transmission end of the second transmission gate (C2) receives the second clock signals (CK2), and a second transmission end of the second transmission gate (C2) outputs the first control signals D1(N). A control end of the fourth N-type transistor (TN4) receives the third control signals D3(N), a first transmission end of the fourth N-type transistor (TN4) connects to the low-reference level (VGL), and a first transmission end of the fourth N-type transistor (TN4) connects to the second transmission end of the second transmission gate (C2).

The latch circuit 14 further includes a third inverter (F3). An input end of the third inverter (F3) receives the second clock signals (CK2), and an output end of the third inverter (F3) connects to the first transmission end of the second transmission gate (C2).

Figure 2:
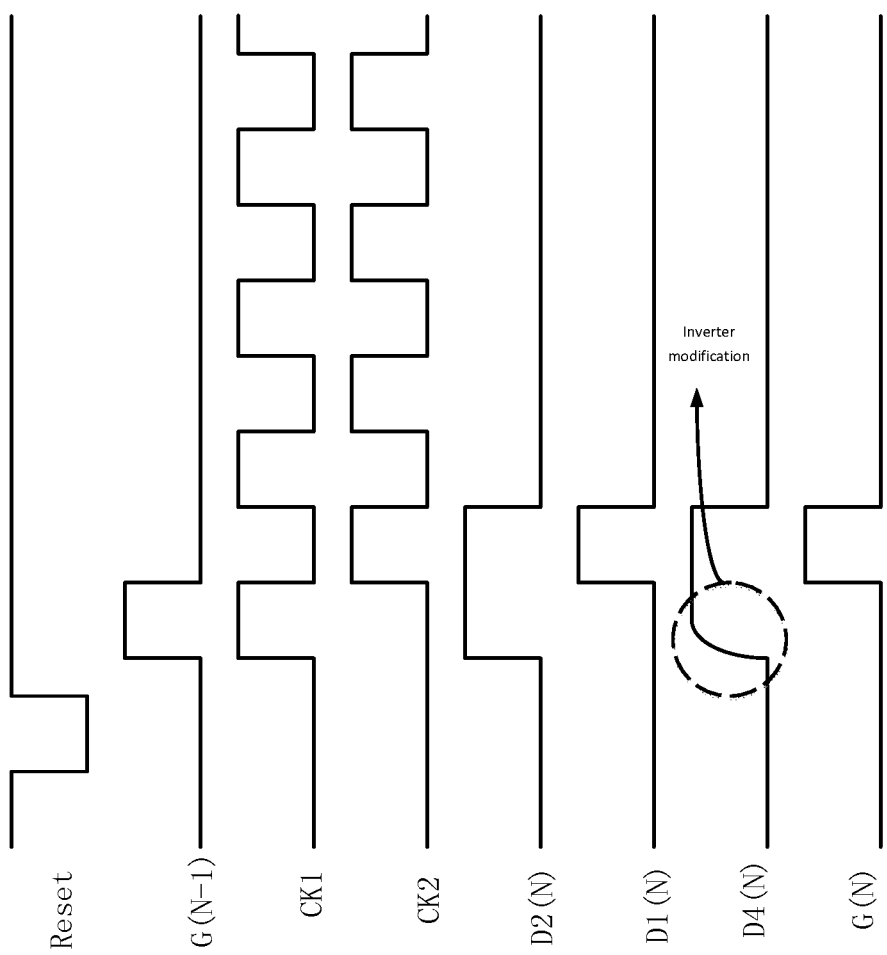
FIG. 2 is a waveform timing diagram of the gate driving circuit in accordance with the first embodiment.

FIG. 2 is a waveform timing diagram of the gate driving circuit in accordance with the first embodiment. When the reset signals (Reset) transits to be low-level pulse signals, the reset and control circuit 12 is reset, wherein the fourth P-type transistor (TP4) is turned on. The third control signals D3(N) outputted from the connecting node of the second transmission end of the third P-type transistor (TP3) and the second transmission end of the fourth P-type transistor (TP4) are at the high level. The first inverter (F1) of the inverting circuit 13 applies the inverting process toward the third control signals D3(N) to obtain the fourth control signals D4(N). The fourth N-type transistor (TN4) of the latch circuit 14 is turned on. The first control signals D1(N) outputted from the latch circuit 14 are at the low level. The first transmission end of the first transmission gate (C1) of the input circuit 11 receives the first control signals D1(N). As the up-level inverting-phase scanning driving signals XG(N−1) received by the N-type control end of the first transmission gate (C1) are at the high level and the up-level normal-phase scanning driving signals G(N−1) received by the P-type control end of the first transmission end are at the low level, the first transmission gate (C1) is turned on and the first P-type transistor (TP1) is turned off. The second control signals D2(N) outputted by the second transmission end of the first transmission gate (C1) are the same with the second control signals D2(N), that is, are at the low level, such that the second P-type transistor (TP2) and the third P-type transistor (TP3) of the reset and control circuit 12 are turned on, and the third control signals D3(N) are latched at the high level.

When the up-level normal-phase scanning driving signals G(N−1) are at the high level, that is, the up-level inverting-phase scanning driving signals XG(N−1) are at the low level, the first transmission gate (C1) of the input circuit 11 is turned off and the first P-type transistor (TP1) is turned on. The outputted second control signals D2(N) are at the high level, the second N-type transistor (TN2) of the reset and control circuit 12 is turned on. At this moment, the reset signals (Reset) are at the high level such that the first N-type transistor (TN1) is turned on. The third control signals D3(N) at low level are outputted, and then the third control signals D3(N) pass through the first inverter (F1) to output the fourth control signals D4(N). The output circuit 15 outputs the current-level normal-phase scanning driving signals G(N) and the current-level inverting-phase scanning driving signals XG(N). When the second clock signals (CK2) are at the high level, the second transmission gate (C2) of the latch circuit 14 is turned on when being controlled by the third control signals D3(N) and the fourth control signals D4(N), and the first control signals D1(N) are outputted. At this moment, the G(N−1) are at the low level, the first transmission gate (C1) is turned on, the second control signals D2(N) are also the high-voltage signals. The second N-type transistor (TN2) and the third N-type transistor (TN3) of the reset and control circuit 12 are turned on. At this moment, the reset signals (Reset) are at the high level, and the first N-type transistor (TN1) is turned on, and the outputted third control signals D3(N) are latched at the low level.

In the first embodiment, by configuring the structure of the circuit, the third control signals D3(N) at the low level are obtained. The fourth control signals D4(N) are then obtained by the inverting process. In this way, the voltage loss of the signals are avoided, which reduces the generation delay of the current-level normal-phase scanning driving signals G(N).

Figure 3:
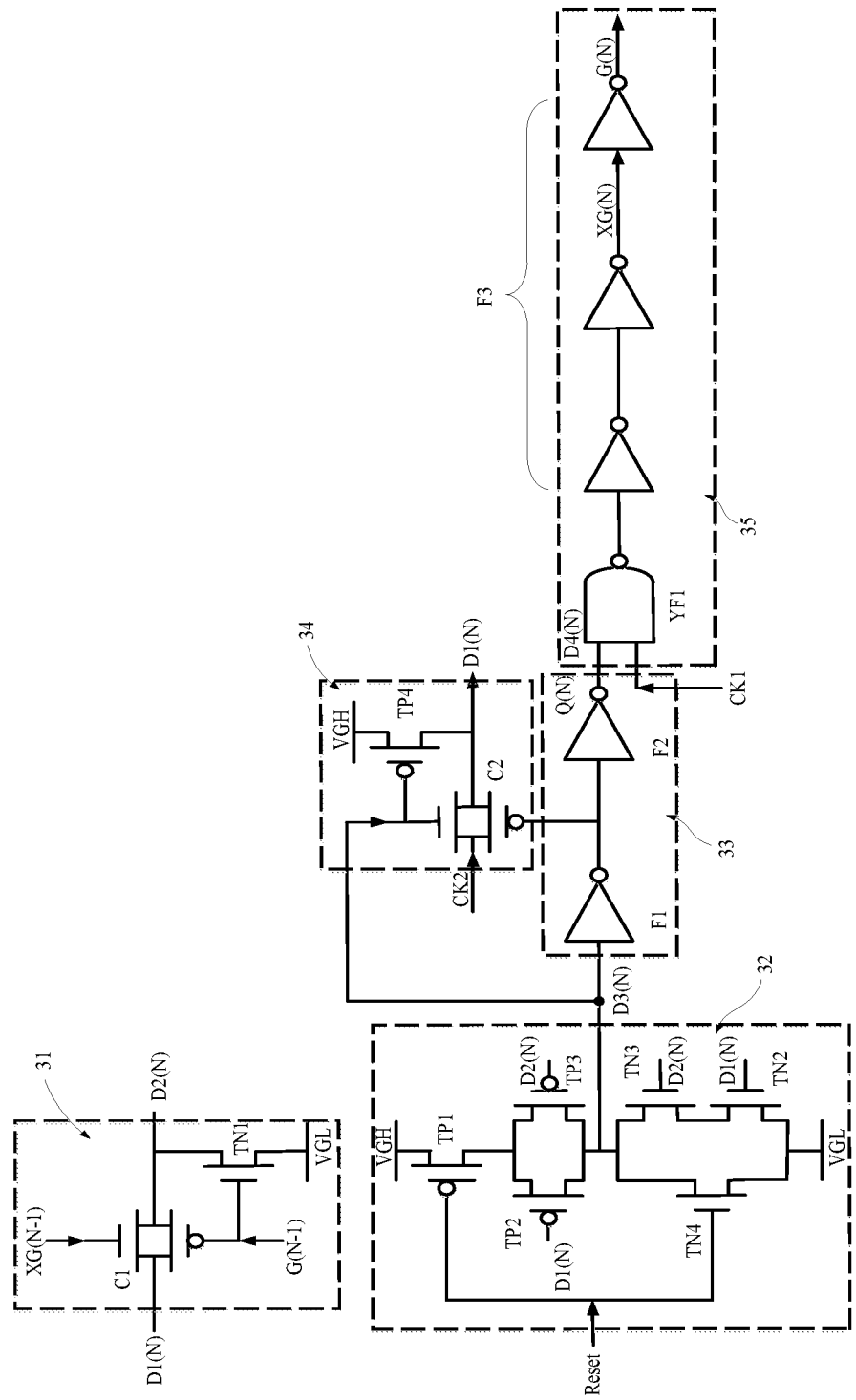
FIG. 3 is a circuit diagram of the gate driving circuit in accordance with a second embodiment.

FIG. 3 is a circuit diagram of the gate driving circuit in accordance with a second embodiment. The gate driving circuit includes:

an input circuit 31, a reset and control circuit 32, an inverting circuit 33, a latch circuit 34, and an output circuit 35. The input circuit 31 generates second control signals D2(N) in accordance with up-level normal-phase scanning driving signals G(N−1), up-level inverting-phase scanning driving signals XG(N−1), and first control signals D1(N) outputted by the latch circuit 34. The reset and control circuit 32 generates third control signals D3(N) in accordance with reset signals (Reset), the first control signals D1(N), and the second control signals D2(N). The inverting circuit 33 performs an inverting process at least once toward the third control signals D3(N), and generates fourth control signals D4(N). The output circuit 35 generates current-level normal-phase scanning driving signals G(N) and the current-level inverting-phase scanning driving signals XG(N) in accordance with the fourth control signals D4(N) and first clock signals (CK1). The latch circuit 34 generates the first control signals D1(N) in accordance with the third control signals D3(N) and second clock signals (CK2), and latches or changes a voltage state of the third control signals D3(N) in accordance with the second clock signals (CK2).

The input circuit 31 includes a first transmission gate (C1) and a first P-type transistor (TP1), wherein the first transmission gate (C1) may be the CMOS transmission gate including a NMOS transistor (TN) and a PMOS transistor (TP) connected in parallel. As the structure of the MOS transistor is symmetrical, that is, the source and the drain are interchangeable. Thus, the input end and the output end of the transmission gate may be interchangeable. That is, the CMOS transmission gate is bidirectional, and thus is referred to as controllable bi-directional switch.

A N-type control end of the first transmission gate (C1) receives the up-level inverting-phase scanning driving signals XG(N−1), and a P-type control end of the first transmission gate (C1) receives the up-level normal-phase scanning driving signals G(N−1). A first transmission end of the first transmission gate (C1) receives the first control signals D1(N), and a second transmission end of the first transmission gate (C1) outputs the second control signals D2(N).

A control end of the first N-type transistor (TN1) receives the up-level normal-phase scanning driving signals G(N−1), a first transmission end of the first N-type transistor (TN1) connects to the low-reference level (VGL), and the second transmission end of the first N-type transistor (TN1) connects to the second transmission end of the first transmission gate (C1).

The reset and control circuit 32 includes a second N-type transistor (TN2), a third N-type transistor (TN3), a fourth N-type transistor (TN4), a first P-type transistor (TP1), a second P-type transistor (TP2), and a third P-type transistor (TP3).

The first transmission end of the second N-type transistor (TN2) connects to the low-reference level (VGL).

A first transmission end of the third N-type transistor (TN3) connects with the second transmission end of the second N-type transistor (TN2). One of the control end of the second N-type transistor (TN2) and the third N-type transistor (TN3) receives the first control signals D1(N), and the other one receives the third control signals D3(N).

The control end of the fourth N-type transistor (TN4) receives the reset signals (Reset), the first transmission end of the fourth N-type transistor (TN4) connects to the low-reference level (VGL), and the second transmission end of the fourth N-type transistor (TN4) connects with the second transmission end of the third N-type transistor (TN3).

A control end of the third P-type transistor (TP3) receives the reset signals (Reset), and a first transmission end of the first P-type transistor (TP1) connects to the high reference level (VGH).

A control end of the second P-type transistor (TP2) receives the first control signals D1(N), a first transmission end of the second P-type transistor (TP2) connects with the second transmission end of the first P-type transistor (TP1), a second transmission end of the second P-type transistor (TP2) connects with the connecting node of the second transmission end of the third N-type transistor (TN3) and the second transmission end of the fourth N-type transistor (TN4).

A control end of the third P-type transistor (TP3) receives the second control signals D2(N), a first transmission end of the third P-type transistor (TP3) connects to the second transmission end of the first P-type transistor (TP1), a second transmission end of the third P-type transistor (TP3) connects to the connecting node of the second transmission end of the third N-type transistor (TN3) and the second transmission end of the fourth N-type transistor (TN4).

The third control signals D3(N) are outputted from the connecting node of the second transmission end of the third N-type transistor (TN3) and the second transmission end of the fourth N-type transistor (TN4).

The inverting circuit 33 includes the first inverter (F1) and the second inverter (F2).

An input end of the first inverter (F1) receives the third control signals D3(N).

An input end of the second inverter (F2) connects to the input end of the first inverter (F1), and an output end of the second inverter (F2) outputs the fourth control signals D4(N).

The output circuit 35 includes the NAND gate (YF1) and a plurality of third inverters (F3) serially connected.

A first input end of the NAND gate (YF1) receives the first clock signals (CK1), a second input end of the NAND gate (YF1) receives the fourth control signals D4(N), an output end of the NAND gate (YF1) connects with upstream input ends of the third inverters (F3) serially connected, the output ends of the M-th third inverter (F3) output the current-level inverting-phase scanning driving signals XG(N), the output end of the N-th third inverter (F3) output the current-level normal-phase scanning driving signals G(N), wherein M is an even number and N is an odd number.

The latch circuit 34 includes the second transmission gate (C2) and the fourth P-type transistor (TP4).

A N-type control end of the second transmission gate (C2) receives the third control signals D3(N), a P-type control end of the second transmission gate (C2) receives the fourth control signals D4(N), a first transmission end of the selection signals (SE) receives the second clock signals (CK2), and the second transmission end of the second transmission gate (C2) outputs the first control signals D1(N).

A control end of the fourth P-type transistor (TP4) receives the third control signals D3(N), a first transmission end of the fourth P-type transistor (TP4) connects to the low-reference level (VGL), and the first transmission end of the fourth P-type transistor (TP4) connects to the second transmission end of the second transmission gate (C2).

Figure 4:
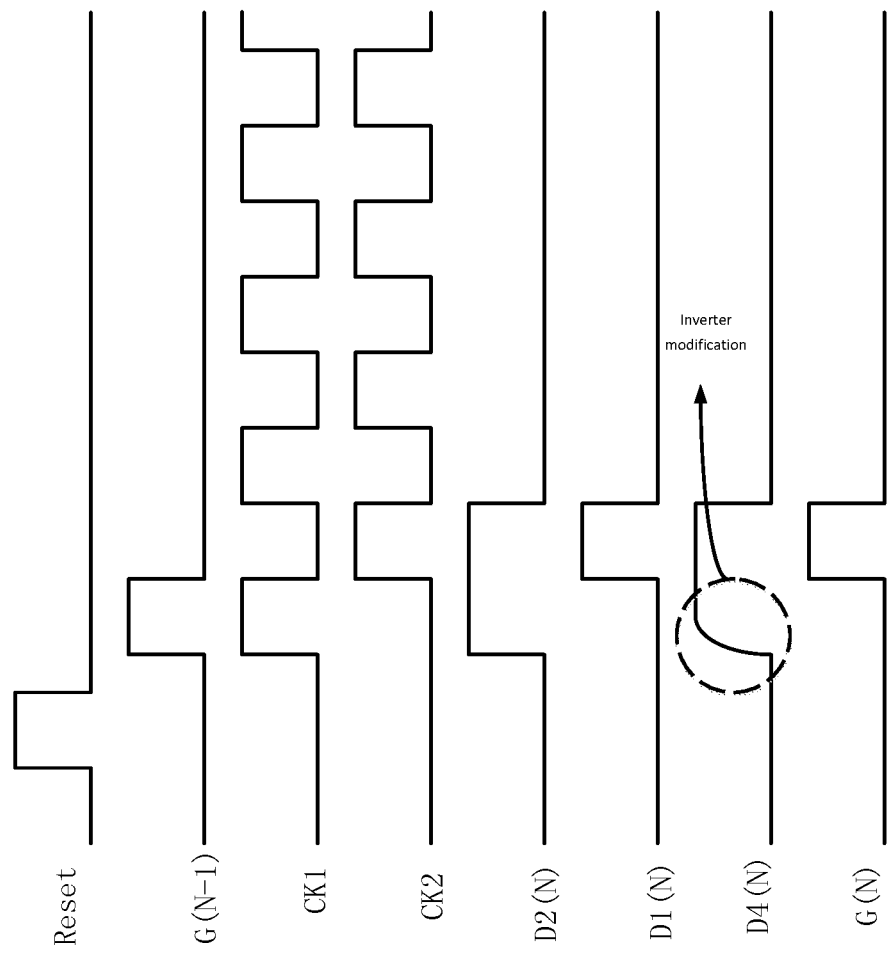
FIG. 4 is a waveform timing diagram of the gate driving circuit in accordance with the second embodiment.

FIG. 4 is a waveform timing diagram of the gate driving circuit in accordance with the second embodiment. When the reset signals (Reset) transits to be high-level pulse signals, the fourth N-type transistor (TN4) of the inverting circuit 33 is turned on, the circuit outputs the third control signals D3(N) at the low level. The fourth P-type transistor (TP4) is turned on. The latch circuit 34 outputs the first control signals D1(N) at the high level. At this moment, the up-level normal-phase scanning driving signals G(N−1) are at the low level, and the up-level normal-phase scanning driving signals G(N−1) are at the high level. The first transmission gate (C1) is turned on, the first N-type transistor (TN1) is turned off, such that the second control signals D2(N) are at the high level. Thus, the second N-type transistor (TN2) and the third N-type transistor (TN3) of the first touch electrode layer 32 are turned on such that the third control signals D3(N) are latched at the low level.

When the up-level normal-phase scanning driving signals G(N−1) are at the high level, that is, the up-level inverting-phase scanning driving signals XG(N−1) are at the low level, the first transmission gate (C1) of the pixel electrode layer 31 is turned off, the first N-type transistor (TN1) is turned on, and the outputted second control signals D2(N) are at the low level. At this moment, the reset signals (Reset) are at the low level, such that the first P-type transistor (TP1) is turned on, and the third P-type transistor (TP3) is turned on. The outputted third control signals D3(N) are at the high level. The second transmission gate (C2) of the latch circuit 34 is turned on when being controlled by the third control signals D3(N) the inverted signals thereof. As shown in FIG. 4, the second clock signals (CK2) are also at the high level. Thus, the first control signals D1(N) outputted by the latch circuit 34 are also at the high level. The first inverter (F1) and the second inverter (F2) of the inverting circuit 33 invert the third control signals D3(N) twice to obtain the fourth control signals D4(N). In the end, the output circuit 35 outputs the current-level normal-phase scanning driving signals G(N) and the current-level inverting-phase scanning driving signals XG(N).

In the second embodiment, by configuring the structure of the circuit, the third control signals D3(N) at the high level are obtained. The fourth control signals D4(N) are then obtained by performing a plurality of inverting processes. In this way, the voltage loss of the signals are avoided, which reduces the generation delay of the current-level normal-phase scanning driving signals G(N).

Figure 5:
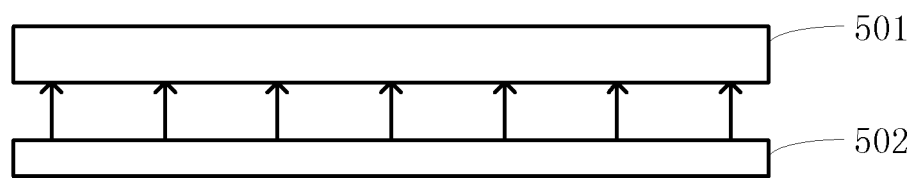
FIG. 5 is a schematic view of the LCD in accordance with one embodiment.

FIG. 5 is a schematic view of the LCD in accordance with one embodiment. The LCD includes a display panel 501 and a backlight 502. The display panel 501 includes a plurality of gate driving circuits cascaded connected. The gate driving circuit may be the gate driving circuit in the first embodiment or be of any possible combinations.

Also, the gate driving circuit may be the gate driving circuit in the second embodiment or be of any possible combinations.

It can be understood that the gate driving circuit may be adopted in other devices than the LCD. For instance, the gate driving circuit may be adopted in OLED display panel so as to be incorporated in phones, displays, and TVs.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gate driving circuit, comprising:
an input circuit, a reset and control circuit, an inverting circuit, a latch circuit, and an output circuit, the input circuit generates second control signals in accordance with up-level normal-phase scanning driving signals, up-level inverting-phase scanning driving signals, and first control signals outputted by the latch circuit, the reset and control circuit generates third control signals in accordance with reset signals, the first control signals, and the second control signals, the inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, the latch circuit generates the first control signals in accordance with the third control signals and second clock signals, and latches or changes a voltage state of the third control signals in accordance with the second clock signals;
wherein the input circuit comprises a first transmission gate and a first P-type transistor;
a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals;
a control end of the first P-type transistor receives the up-level inverting-phase scanning driving signals, and a first transmission end of the first P-type transistor connects to a high reference level, and a second transmission end of the first P-type transistor connects to the second transmission end of the first transmission gate;
wherein the output circuit comprises a NAND gate and a plurality of second inverters serially connected, a first input end of the NAND gate receives the first clock signals, a second input end of the NAND gate receives the fourth control signals, an output end of the NAND gate connects with an upstream input end of the second inverters serially connected, the output end of the M-th second inverter outputs the current-level inverting-phase scanning driving signals, the output end of the N-th second inverter outputs the current-level normal-phase scanning driving signals, wherein M is an even number and N is an odd number.

2. A gate driving circuit, comprising:
an input circuit, a reset and control circuit, an inverting circuit, a latch circuit, and an output circuit, the input circuit generates second control signals in accordance with up-level normal-phase scanning driving signals, up-level inverting-phase scanning driving signals, and first control signals outputted by the latch circuit, the reset and control circuit generates third control signals in accordance with reset signals, the first control signals, and the second control signals, the inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, the latch circuit generates the first control signals in accordance with the third control signals and second clock signals, and latches or changes a voltage state of the third control signals in accordance with the second clock signals;
wherein the input circuit comprises a first transmission gate and a first P-type transistor;

a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; and a control end of the first P-type transistor receives the up-level inverting-phase scanning driving signals, and a first transmission end of the first P-type transistor connects to a high reference level, and a second transmission end of the first P-type transistor connects to the second transmission end of the first transmission gate;

wherein the reset and control circuit comprises a second P-type transistor, a third P-type transistor, a fourth P-type transistor, a first N-type transistor, a second N-type transistor, and a third N-type transistor;

a first transmission end of the second P-type transistor connects to the high reference level;

a first transmission end of the third P-type transistor connects to the second transmission end of the second P-type transistor, one of a control end of the second P-type transistor and a control end of the third P-type transistor receives the first control signals, and the other one receives the second control signals;

a control end of the fourth P-type transistor receives the reset signals, a first transmission end of the fourth P-type transistor connects to the high reference level, and a second transmission end of the fourth P-type transistor connects to the second transmission end of the third P-type transistor;

a control end of the first N-type transistor receives the reset, a first transmission end of the first N-type transistor connects to a connecting node of the second transmission end of the third P-type transistor and a second transmission end of the fourth P-type transistor;

a control end of the second N-type transistor receives the first control signals, a first transmission end of the second N-type transistor connects to the second transmission end of the first N-type transistor, and a second transmission end of the second N-type transistor connects to a low-reference level;

a control end of the third N-type transistor receives the second control signals, a first transmission end of the third N-type transistor connects to the second transmission end of the first N-type transistor, and a second transmission end of the third N-type transistor connects to the low-reference level; and wherein the third control signals are outputted from the connecting node of the second transmission end of the third P-type transistor and the second transmission end of the fourth P-type transistor.

3. The gate driving circuit as claimed in claim 2, wherein the inverting circuit comprises a first inverter, an input end of the first inverter receives the third control signals, and an output end of the first inverter outputs the fourth control signals.

4. The gate driving circuit as claimed in claim 2, wherein the output circuit comprises a NAND gate and a plurality of second inverters serially connected; and a first input end of the NAND gate receives the first clock signals, a second input end of the NAND gate receives the fourth control signals, an output end of the NAND gate connects with an upstream input end of the second inverters serially connected, the output end of the M-th second inverter outputs the current-level inverting-phase scanning driving signals, the output end of the N-th second inverter outputs the current-level normal-phase scanning driving signals, wherein M is an even number and N is an odd number.

5. The gate driving circuit as claimed in claim 3, wherein the latch circuit comprises a second transmission gate and a fourth N-type transistor;

a P-type control end of the second transmission gate receives the third control signals, a N-type control end of the second transmission gate receives the fourth control signals, a first transmission end of the second transmission gate receives the second clock signals, and a second transmission end of the second transmission gate outputs the first control signals; and a control end of the fourth N-type transistor receives the third control signals, a first transmission end of the fourth N-type transistor connects to the low-reference level, and a first transmission end of the fourth N-type transistor connects to the second transmission end of the second transmission gate.

6. The gate driving circuit as claimed in claim 5, wherein the latch circuit further comprises a third inverter, an input end of the third inverter receives the second clock signals, and an output end of the third inverter connects to the first transmission end of the second transmission gate.

7. A liquid crystal device (LCD), comprising:

a plurality of cascaded gate driving circuits, the gate driving circuit comprises:

an input circuit, a reset and control circuit, an inverting circuit, a latch circuit, and an output circuit, the input circuit generates second control signals in accordance with up-level normal-phase scanning driving signals, up-level inverting-phase scanning driving signals, and first control signals outputted by the latch circuit, the reset and control circuit generates third control signals in accordance with reset signals, the first control signals, and the second control signals, the inverting circuit performs an inverting process at least once toward the third control signals, and generates fourth control signals, the output circuit generates current-level normal-phase scanning driving signals and the current-level inverting-phase scanning driving signals in accordance with the fourth control signals and first clock signals, the latch circuit generates the first control signals in accordance with the third control signals and second clock signals, and latches or changes a voltage state of the third control signals in accordance with the second clock signals;

wherein the input circuit comprises a first transmission gate and a first P-type transistor; a N-type control end of the first transmission gate receives the up-level inverting-phase scanning driving signals, and a P-type control end of the first transmission gate receives the up-level normal-phase scanning driving signals, a first transmission end of the first transmission gate receives the first control signals, and a second transmission end of the first transmission gate outputs the second control signals; and a control end of the first P-type transistor receives the up-level inverting-phase scanning driving signals, and a first transmission end of the first P-type transistor connects to a high reference level, and a second transmission end of the first P-type transistor connects to the second transmission end of the first transmission gate;

wherein the reset and control circuit comprises a second P-type transistor, a third P-type transistor, a fourth P-type transistor, a first N-type transistor, a second N-type transistor, and a third N-type transistor;

a first transmission end of the second P-type transistor connects to the high reference level; a first transmission end of the third P-type transistor connects to the second transmission end of the second P-type transistor, one of a control end of the second P-type transistor and a control end of the third P-type transistor receives the first control signals, and the other one receives the second control signals;

a control end of the fourth P-type transistor receives the reset signals, a first transmission end of the fourth P-type transistor connects to the high reference level, and a second transmission end of the fourth P-type transistor connects to the second transmission end of the third P-type transistor;

a control end of the first N-type transistor receives the reset, a first transmission end of the first N-type transistor connects to a connecting node of the second transmission end of the third P-type transistor and a second transmission end of the fourth P-type transistor;

a control end of the second N-type transistor receives the first control signals, a first transmission end of the second N-type transistor connects to the second transmission end of the first N-type transistor, and a second transmission end of the second N-type transistor connects to a low-reference level;

a control end of the third N-type transistor receives the second control signals, a first transmission end of the third N-type transistor connects to the second transmission end of the first N-type transistor, and a second transmission end of the third N-type transistor connects to the low-reference level; and wherein the third control signals are outputted from the connecting node of the second transmission end of the third P-type transistor and the second transmission end of the fourth P-type transistor.

8. The LCD as claimed in claim 7, wherein the inverting circuit comprises a first inverter, an input end of the first inverter receives the third control signals, and an output end of the first inverter outputs the fourth control signals.

9. The LCD as claimed in claim 7, wherein the output circuit comprises a NAND gate and a plurality of second inverters serially connected; and a first input end of the NAND gate receives the first clock signals, a second input end of the NAND gate receives the fourth control signals, an output end of the NAND gate connects with an upstream input end of the second inverters serially connected, the output end of the M-th second inverter outputs the current-level inverting-phase scanning driving signals, the output end of the N-th second inverter outputs the current-level normal-phase scanning driving signals, wherein M is an even number and N is an odd number.

10. The LCD as claimed in claim 8, wherein the latch circuit comprises a second transmission gate and a fourth N-type transistor;

a P-type control end of the second transmission gate receives the third control signals, a N-type control end of the second transmission gate receives the fourth control signals, a first transmission end of the second transmission gate receives the second clock signals, and a second transmission end of the second transmission gate outputs the first control signals; and a control end of the fourth N-type transistor receives the third control signals, a first transmission end of the fourth N-type transistor connects to the low-reference level, and a first transmission end of the fourth N-type transistor connects to the second transmission end of the second transmission gate.

11. The LCD as claimed in claim 10, wherein the latch circuit further comprises a third inverter, an input end of the third inverter receives the second clock signals, and an output end of the third inverter connects to the first transmission end of the second transmission gate.

* * * * *